United States Patent
Kohara et al.

[19]

[11] Patent Number: 5,918,111
[45] Date of Patent: Jun. 29, 1999

[54] METHOD AND APPARATUS FOR MANUFACTURING CHALCOPYRITE SEMICONDUCTOR THIN FILMS

[75] Inventors: Naoki Kohara; Takayuki Negami, both of Osaka; Mikihiko Nishitani, Nara; Takahiro Wada, Osaka, all of Japan

[73] Assignee: Matsushita Electric Industrial Co., Ltd., Osaka, Japan

[21] Appl. No.: 08/613,497

[22] Filed: Mar. 11, 1996

[30] Foreign Application Priority Data

Mar. 15, 1995 [JP] Japan ...................................... 7-055785
Mar. 27, 1995 [JP] Japan ...................................... 7-068272

[51] Int. Cl.$^6$ .................................................. H01L 31/18
[52] U.S. Cl. .................................................. 438/95
[58] Field of Search ............................... 438/93, 95, 102, 438/104, 483; 136/256, 260, 266, 265; 257/184, 201; 427/76

[56] References Cited

U.S. PATENT DOCUMENTS

| | | | |
|---|---|---|---|
| 4,915,745 | 4/1990 | Polock et al. | 136/265 |
| 5,286,306 | 2/1994 | Menezes | 136/249 |
| 5,356,839 | 10/1994 | Futtle et al. | 438/95 |
| 5,422,304 | 6/1995 | Koihki et al. | 136/265 |
| 5,441,897 | 8/1995 | Noufi et al. | 437/5 |
| 5,445,847 | 8/1995 | Wada et al. | 427/74 |
| 5,578,503 | 11/1996 | Karq et al. | 438/95 |
| 5,674,555 | 10/1997 | Birkmire et al. | 438/95 |
| 5,730,852 | 3/1998 | Charya et al. | 136/264 |

FOREIGN PATENT DOCUMENTS

| | | |
|---|---|---|
| 0 067 860 | 6/1989 | European Pat. Off. . |
| 0 534 459 | 3/1993 | European Pat. Off. . |
| 0 595 115 | 5/1994 | European Pat. Off. . |
| 0 638 939 | 2/1995 | European Pat. Off. . |
| 0 638 532 | 4/1995 | European Pat. Off. . |
| 7-211927 | 8/1995 | Japan . |

*Primary Examiner*—John F. Niebling
*Assistant Examiner*—S. Mulpuri
*Attorney, Agent, or Firm*—Merchant, Gould, Smith, Edell, Welter & Schmidt, P.A.

[57] ABSTRACT

The method and the apparatus of manufacturing the I-III-VI$_2$ type chalcopyrite semiconductor thin films of the present invention control the film composition easily and improve the reproducibility of films by monitoring the composition of the films during forming the films. The apparatus comprise the substrate holder and heater which are in the vacuum chamber and Mo-coated glass substrate on which Cu(In,Ga)Se$_2$ films are deposited. The change of the substrate temperature is monitored by the use of a heating element to heat the substrate by releasing a certain quantity of heat, a mechanism of measuring a temperature of the heated substrate. The change of power supplied is monitored by the use of a power source for the heating element to keep the substrate at a certain temperature and a mechanism of monitoring the change of the power supplied to the heating element. The changes in substrate temperature or power supplied can be correlated to the film composition.

15 Claims, 10 Drawing Sheets

METHOD AND APPARATUS FOR MANUFACTURING CHALCOPYRITE SEMICONDUCTOR THIN FILMS

FIELD OF THE INVENTION

The present invention relates to a method and an apparatus for manufacturing chalcopyrite semiconductor thin films which are used for thin film solar cells.

BACKGROUND OF THE INVENTION

A chalcopyrite semiconductor thin film comprising Group I, III, and VI elements which are used for an absorption layer of solar cells has a high absorption coefficient and is available for photovoltaic applications to solar cells. The chalcopyrite semiconductor thin films, such as $Cu(In,Ga)Se_2$ thin film, are formed by the Bi-layer method, namely; a chalcopyrite layer containing excessive Cu of Group I elements are formed, thereon a chalcopyrite layer containing excessive Group III elements (In,Ga) is formed. As a result, the crystal grain size becomes bigger. Moreover, the Bi-layer method is also used so as not to precipitate a different phase compound such as $Cu_{2-x}Se$. However, according to the method, many component elements are evaporated at the same time during forming films, it is difficult to control the composition of $Cu(In, Ga)Se_2$ thin film, and reproducibility of films is not so good. $Cu(In,Ga)Se_2$ thin film formed by this method has low adhesion to the under-part of an electrode, which has been a problem in the practical application of solar cells.

As a means of solving the above mentioned problem, Contreras et al of National Renewable Energy Laboratory (NREL), proposed a method of forming $Cu(In,Ga)Se_2$ thin film at the 1st World Conference on Photovoltaic Energy Conversion in December 1994. They proposed the 3-Stage method. According to the 3-Stage method, $Cu_2Se$ is evaporated on $(In,Ga)_2Se_3$ precursor film of the first layer until the thin films have a Cu-rich composition, thereon $(In,Ga)_2Se_3$ of the third layer is evaporated so as to form again a (In, Ga)-rich composition. (The term "rich" is same meaning as "excessive".) According to this method, since a few component elements are used during forming films, the reproducibility of thin films containing optional composition is good.

When forming the 2-Stage $Cu(In,Ga)Se_2$ thin films which have the same composition as 3-Stage thin films by applying the 3-Stage method proposed by NREL, the crystal grain size of the 2-stage $Cu(In,Ga)Se_2$ film is small compared with 3-stage $Cu(In,Ga)Se_2$ film and the conversion efficiency is low when the films are used in solar cells. Therefore, in the 3-Stage method, when evaporating $Cu_2Se$ of the second layer, Cu and Se must be evaporated until the films are Cu-rich. During this process, it is difficult to predict the final composition of films after $(In,Ga)_2Se_3$ of the third layer is evaporated unless the composition is recognized during forming films. If the final composition of the thin film is Cu-rich, a different phase compound such as $Cu_{2-x}Se$ will consequently precipitate and deteriorate the properties of solar cells. Moreover, though a condition of flux from various source evaporation is once established by experiments in order to make a proper composition of Cu, it is difficult to reproduce films of the same composition due to a subtle difference of degree of vacuum condition or types of residual gas. Therefore, the problems in forming $Cu(In, Ga)Se_2$ thin film are: to control $Cu(In, Ga)Se_2$ thin film to be a proper Cu-rich composition with good reproducibility in depositing $Cu_2Se$ of the second layer; and to control films to be a proper (In,Ga)-rich composition with good reproducibility in depositing $(In,Ga)_2Se_3$ of the third layer.

In addition, when thin films are Se-deficient in the process of forming the $Cu(In,Ga)Se_2$ thin films, the films tend to have a metallic property, and such Se-deficient films can not function as an absorption layer of solar cells.

An object of the present invention is to solve the prior problem and to provide a method and an apparatus of manufacturing the chalcopyrite semiconductor thin films whose composition can easily be controlled and reproducibility is good.

SUMMARY OF THE INVENTION

According to the present invention, there is provided a method of manufacturing the chalcopyrite semiconductor thin films comprising using a heating element to heat a substrate by releasing a certain quantity of heat and then measuring a temperature of the heated substrate, the method further comprising the forming steps of:

depositing thin films of the first layer comprising at least one compound selected from the group consisting of (A)–(F) on the heated substrate;
  (A) Group III elements and Group VI elements,
  (B) Group III-VI elements compound,
  (C) Group I, III, and VI elements in stoichiometric amounts,
  (D) Group $I$-$III$-$VI_2$ elements compound with a stoichiometric composition,
  (E) Group I, III, and VI elements in amounts containing excessive Group III elements, and
  (F) Group $I$-$III$-$VI_2$ element compound with a composition containing excessive Group III elements;

depositing thin films of the second layer comprising at least one compound selected from the group consisting of (a)–(f) on the first layer in order to form the chalcopyrite semiconductor thin films with a composition containing excessive Group I elements:
  (a) Group I elements and Group VI elements,
  (b) Group I-VI elements compound,
  (c) Group I, III, and VI elements in stoichiometric amounts,
  (d) Group $I$-$III$-$VI_2$ elements compound with a stoichometric composition,
  (e) Group I, III and VI elements in amounts containing excessive Group I elements, and
  (f) Group $I$-$III$-$VI_2$ elements compound with a composition containing excessive Group I elements; and depositing thin films of the third layer comprising at least one compound selected from the group consisting of (A)–(F) again in order to form the chalcopyrite semiconductor thin films with the stoichiometric composition or a composition containing excessive Group III elements.

It is preferable in the method of the present invention that the deposition of the second layer stops when the substrate temperature drops, thereby after showing saturation during the deposition of the second layer.

It is preferable in the method of the present invention that the deposition of the third layer stops when the dropped temperature of the substrate rises, thereby showing saturation again during the deposition of the third layer.

It is preferable in the method of the present invention that the substrate temperature is kept at a higher temperature than the dissolving temperature of Group I-VI elements compound in the process of the deposition of the second layer.

It is preferable in the method of the present invention that the forming process stops when a drop of the substrate temperature is observed at a different point than that when the substrate temperature drops during deposition of the second layer in the process of the deposition of the first, second, and third layers. More specifically, according to the apparatus of the present invention, if Group VI elements are deficient during forming films, the property of films are metallic so that the same phenomenon as in FIG. 2; the composition changes from a composition containing excessive Group III element to a composition containing excessive Group I element are shown. In other words, the temperature are observed to drop. Since the change which drops at the different point from the normal changing point means abnormality, the defective films which are too inferior to be suitable to the apparatus can be found earlier. If the formation of films stops in case of such abnormality by installing the interlock mechanism to the apparatus, the method of the present invention permits reducing the percent of defective films.

It is preferable in the method of the present invention that an evaporation source of Group VI elements is supplemented after the formation of films stops.

It is preferable in the method of the present invention that at least one element selected from the group consisting of Cu and Ag is used as Group I elements.

It is preferable in the method of the present invention that at least one element selected from the group consisting of In, Ga, and Al is used as Group III elements.

It is preferable in the method of the present invention that at least one element selected from the group consisting of S, Se and Te is used as Group VI elements.

It is further preferable in the apparatus of the present invention that a power source of the heating element to keep the substrate at a certain temperature and a mechanism for monitoring the change of the power supplied to the heating element are used as a substitute for the heating element to heat the substrate by releasing a certain quantity of heat.

It is preferable in the method of the present invention that the deposition of the second layer stops when the power supplied increases, thereby showing the saturation property during the deposition of the second layer.

It is preferable in the method of the present invention that the deposition of the third layer stops when the power supplied to the heating element decreases and shows saturation again after showing an increase during the deposition of the third layer.

It is preferable in the method of the present invention that the substrate temperature is kept at a higher temperature than that dissolving Group I–VI element compound in the process of depositing the second layer.

It is preferable in the method of the present invention that the forming process stops when an increase of power supplied to the heating element is observed at a different point than that when the power supplied to the heating element increase after the saturation point during deposition of the second layer in the process of the deposition of the first, second, and third layers.

It is preferable in the method of the present invention that an evaporation of Group VI element is supplemented after the formation of films stops.

It is preferable in the method of the present invention that at least one element selected from the group consisting of Cu and Ag is used as Group I elements.

It is preferable in the method of the present invention that at least one element selected from the group consisting of In, Ga, and Al is used as III group elements.

It is preferable in the method of the present invention that at least one element selected from the group consisting of S, Se and Te is used as Group VI elements.

It is preferable in the method of the present invention that the thickness of the first layer is 0.1–2.5 $\mu$m, that of the second layer is 0.1–1.5 $\mu$m, that of the third layer is 0.1–2.0 $\mu$m, and the total thickness of the thin films is 0.3–6.0 $\mu$m.

According to another aspect of the present invention, there is provided an apparatus for manufacuturing the chalcopyrite semiconductor thin films comprising a heating element to heat the substrate by releasing a certain quantity of heat, a mechanism for measuring a temperature of the heated substrate, and a mechanism for controlling the flux from each film component evaporation source according to the change of the substrate temperature.

It is preferable in the apparatus of the present invention that a mechanism for measuring a temperature of the heated substrate is a thermo-couple or an apparatus for measuring intensity of infrared radiation.

It is preferable in the apparatus of the present invention that a power source of the heating element to keep the substrate at a certain temperature and a mechanism for monitoring a change of the power supplied to the heating element are used as a substitute for the heating element for heating the substrate by releasing a certain quantity of heat.

It is preferable in the apparatus of the present invention that a mechanism for measuring a temperature of the heated substrate is a thermo-couple or an apparatus for measuring intensity of infrared radiation.

According to the method of the present invention, the I-III-VI$_2$ type chalcopyrite semiconductor thin films are formed as follows: depositing thin films of the first layer comprising at least one compound selected from the group consisting of the above mentioned (A)–(F) on the heated substrate; depositing thin films of the second layer comprising of at least one compound selected from the group consisting of above mentioned (a)–(f) on the first layer in order to form the chalcopyrite semiconductor thin films with a composition containing excessive Group I elements; and depositing thin films of the third layer comprising at least one compound selected from the group consisting of the (A)–(F) again in order to form the chalcopyrite semiconductor thin films with the stoichiometric composition or a composition containing excessive Group III elements. Thus the method of the present invention permits controlling the composition easily and manufacturing the chalcopyrite semiconductor thin films with good reproducibility.

According to the preferable example of the present invention in which the deposition of the second layer stops when the substrate temperature drops after showing saturation property during the deposition of the second layer, or when the power supplied increases after showing the saturation property during the deposition of the second layer, the point changing from composition containing excessive Group III elements to composition containing excessive Group I elements can be measured during during forming films. Consequently, the reproducibility of the films becomes good.

According to the preferable example of the present invention in which the deposition of the third layer stops when the dropped temperature of the substrate rises and shows saturation property again or when the power supplied to the heating element decreases and shows saturation after showing an increase during the deposition of the third layer, the point changing from composition containing excessive Group I elements to composition containing Group III elements can be measured during forming films. Consequently, the reproducibility of the films becomes good.

According to the preferable example of the present invention in which the substrate temperature is kept at a higher temperature than the dissolving temperature of Group I-VI compound in the process of the deposition of the second layer, films are formed with making use of the liquid phase flux in a growth of crystal. Therefore, high-quality crystals with big grain size and little internal defect can be obtained. Moreover, since the substrate temperature can be measured sensitively, the change of the substrate temperature can be monitored efficiently.

According to the preferable example of the present invention in which the forming process stops during the process of depositing the first, second, or third layers, when a drop of the substrate temperature is observed at a different point that the substrate temperature of the second layer drops or when an increase of the power supplied to the heating element is observed at a different point that the power supplied to the heating element of the second layer increases caused by a deficiency of Group VI elements can be sensed. Moreover, the percent of defective films can be reduced, as the formation of films stops.

According to the preferable example of the present invention in which a source evaporation of Group VI compound is supplemented after the formation of films stops, a drop of the substrate temperature caused by a deficiency of Group VI elements can be sensed as soon as possible. As a result, the method of the present invention permits reducing the percent of defective films and improving the yield.

According to the preferable example of the present invention that: at least one element selected from the group consisting of Cu and Ag is used as Group I elements; at least one element selected from the group consisting of In, Ga, and Al is used as Group III elements; and at least one element selected from the group consisting of S, Se and Te is used as Group VI elements; the method can be applied to manufacturing absorption layer of solar cells containing these elements.

According to the another preferable example of the present invention, there is provided either an apparatus with a heating element to heat the substrate by releasing a certain quantity of heat, a mechanism for measuring the heated substrate, and a mechanism for controlling the flux from each source evaporation according to the change of the substrate temperature or an apparatus with a heating element to heat the substrate, a mechanism for measuring the heated substrate, a power source for the heating element to keep the substrate at a certain temperature, a mechanism for measuring the change of the power to the heating element and a mechanism for controlling the flux from each source evaporation according to the change of the power supplied. Therefore, the apparatus permits forming the chalcopyrite semiconductor thin films efficiently by controlling the composition of films automatically during forming films.

According to the preferable example of the present invention in which a mechanism for measuring a temperature of the heated substrate is a thermo-couple or an apparatus for measuring intensity of infrared radiation, the substrate temperature can be measured at low cost without using an expensive apparatus and also the change of the substrate temperature can be monitored sensitively. The use of the thermocouple makes it possible to measure the substrate temperature from both back and front side of the substrate, so that the apparatus can be structured more freely. Moreover, the use of the apparatus for measuring intensity of infrared radiation makes possible to monitor the substrate temperature from outside of a vacuum chamber through the transmission window installed to the vacuum chamber.

DETAILED DESCRIPTION OF THE INVENTION

The invention will be explained in detail with reference to the attached figures and the following examples.

According to the method and apparatus of munufacturing the I-III-VI$_2$ type chalcopyrite semiconductor thin films of the present invention, to form the chalcopyrite semiconductor thin films such as a Cu(In, Ga)Se$_2$ thin film, an apparatus comprising a heating element to heat the substrate by releasing a certain quantity of heat, a mechanism for measuring the heated substrate, and a mechanism for controlling the flux from each evaporation source according to the change of the substrate temperature is used. Moreover, an apparatus comprising a heating element to heat the substrate, a mechanism for measuring the heated substrate, a power source for the heating element to keep the substrate at a certain temperature, and a mechanism for controlling the flux from each evaporation source according to the change of the power suppleid to the heating element is also used. Thus the method and apparatus for manufactuing the chalcopyrite semiconductor thin films permits controlling a change in the composition of films automatically, namely: from a (In, Ga)-rich composition to a Cu-rich composition; and from a Cu-rich composition to a (In,Ga)-rich composition. Therefore, no adjustment of power supplied from each evaporation source is required in the process of forming films. Moreover, throughput in the manufacturing process and reproducibility of quality in films can be improved. In other words, forming high-quality films with good reproducibility in large quantities makes it possible to reduce the percent of defective films and to improve the production efficiency.

Specifically, the apparatus for manufacturing the chalcopyrite semiconductor thin films can measure the substrate temperature during heating the substrate by the use of a mechanism to heat the substrate, and a heating mechanism of the substrate which can release a certain quantity of heat, and the use of a mechanism for controlling the flux from each source evaporation; or a temperature monitor for measuring the heated substrate, a feedback circuit for controlling the power supplied to the heating element to keep the substrate at a certain temperature, a power monitor for monitoring the change of the power, and a circuit for controlling the flux from each evaporation source according to the change of the power supplied. The flux from each evaporation source can be changed by opening and closing of a shutter installed on the K-cell. In order to monitor the substrate temperature, a thermo-couple or a temperature monitor for measuring intensity of infrared radiation is used.

EXAMPLE 1

Figure 1:
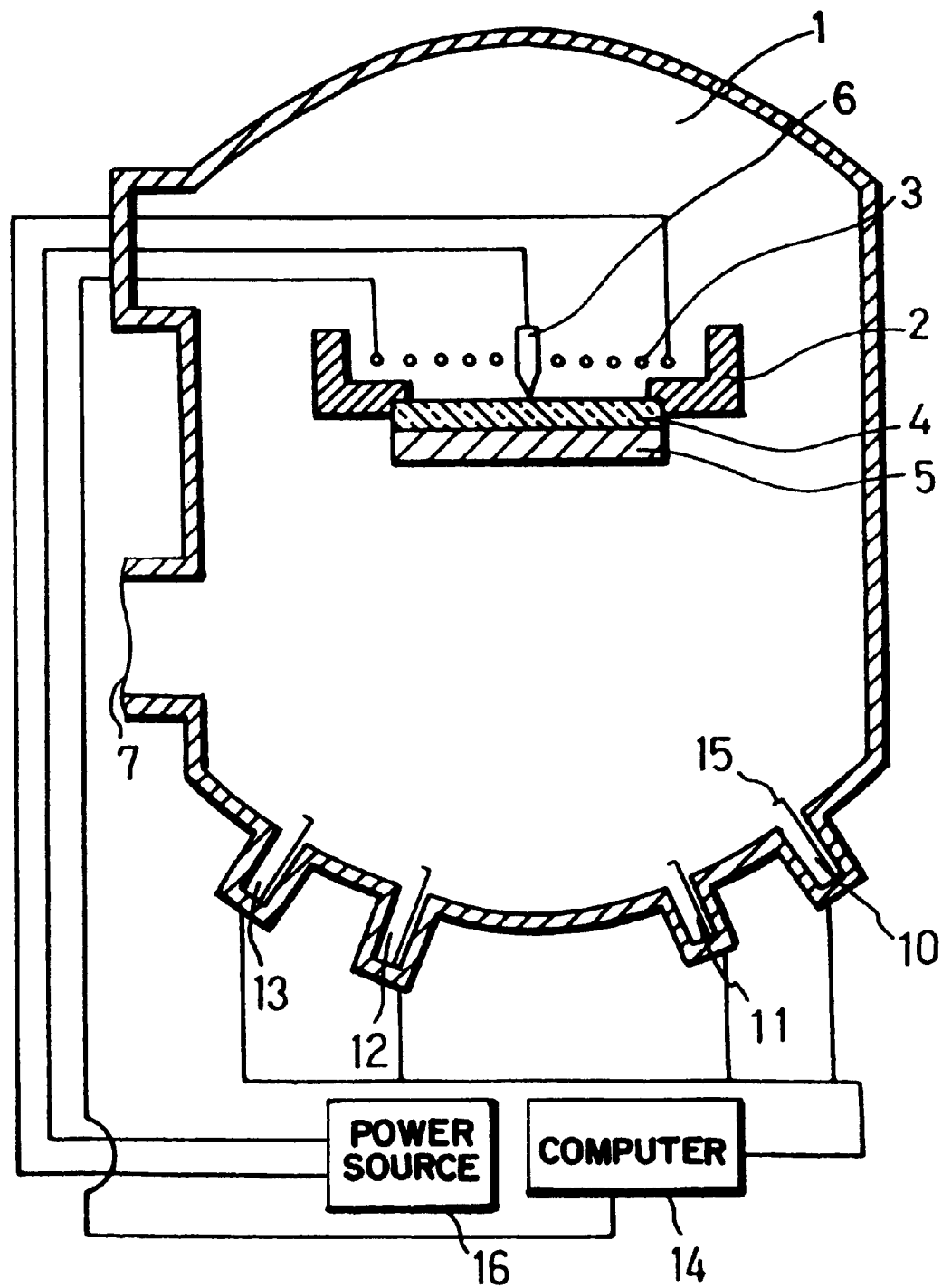
FIG. 1 is a cross sectional view of the apparatus of manufacturing the chalcopyrite semiconductor thin films of the first embodiment of the invention.

FIG. 1 shows the apparatus of manufacturing the chalcopyrite semiconductor thin films of the present invention. The apparatus and method will be explained as follows.

A substrate holder 2 and tantalum heater 3 for heating the substrate were installed in a vacuum chamber 1 comprising an exhaust hole 7 shown in FIG. 1. A 2 $\mu$m thick Cu(In, Ga)Se$_2$ thin film 5 was deposited on the 1 mm-thick soda-lime glass substrate 4 which is coated by a 1 $\mu$m-thick layer of Mo. When the substrate was heated, a certain value of power was added on a tantalum heater 3 from the power source 16. Thus, the substrate temperature was controlled so as to obtain a target temperature. The computer 14 was installed so that the flux from the source evaporation can be automatically controlled according to the change of power supplied by opening and closing of the shutter 15 which was installed on the K-cell comprising each evaporation source. The substrate temperature was measured from the back side of the substrate with the thermo-couple 6 installed in the substrate holder. In the vacuum chamber, the main components of Cu(In, Ga)Se$_2$, i.e. an evaporation source of Cu, 10; an evaporation source of In, 11; an evaporation source of Ga, 12; and an evaporation source of Se, 13, were provided. In the vacuum of 10$^{-7}$ Torr, the temperatures of each of the evaporation crucibles of Cu, In, Ga, and Se were heated respectively to 1220° C., 850° C., 900° C., and 180° C. Cu(In, Ga)Se$_2$ thin film was formed by evaporating In, Ga, and Se on the first and third layers; and by evaporating Cu and Se on the second layer. At this time, the substrate temperature of the first layer was constant at 300° C.; and the substrate temperature of the second and third layers were constant at 550° C. Cu and Se for the second layer were evaporated until the layer had Cu-rich composition. Moreover, In, Ga, and Se were evaporated again so as to make the final composition ratio (atomic ratio) Cu/(In, Ga)=about 0.8–1.0. The thickness of each layer was; 1.0 $\mu$m thick for the first layer; 0.8 $\mu$m thick for the second layer; and 0.2 $\mu$m thick for the third layer. The size of the apparatus of FIG. 1 was 100 cm high and 50 cm width. The distance between the K-cell and the substrate was 30 cm. In addition, 7 shows an exhaust hole.

Figure 2:
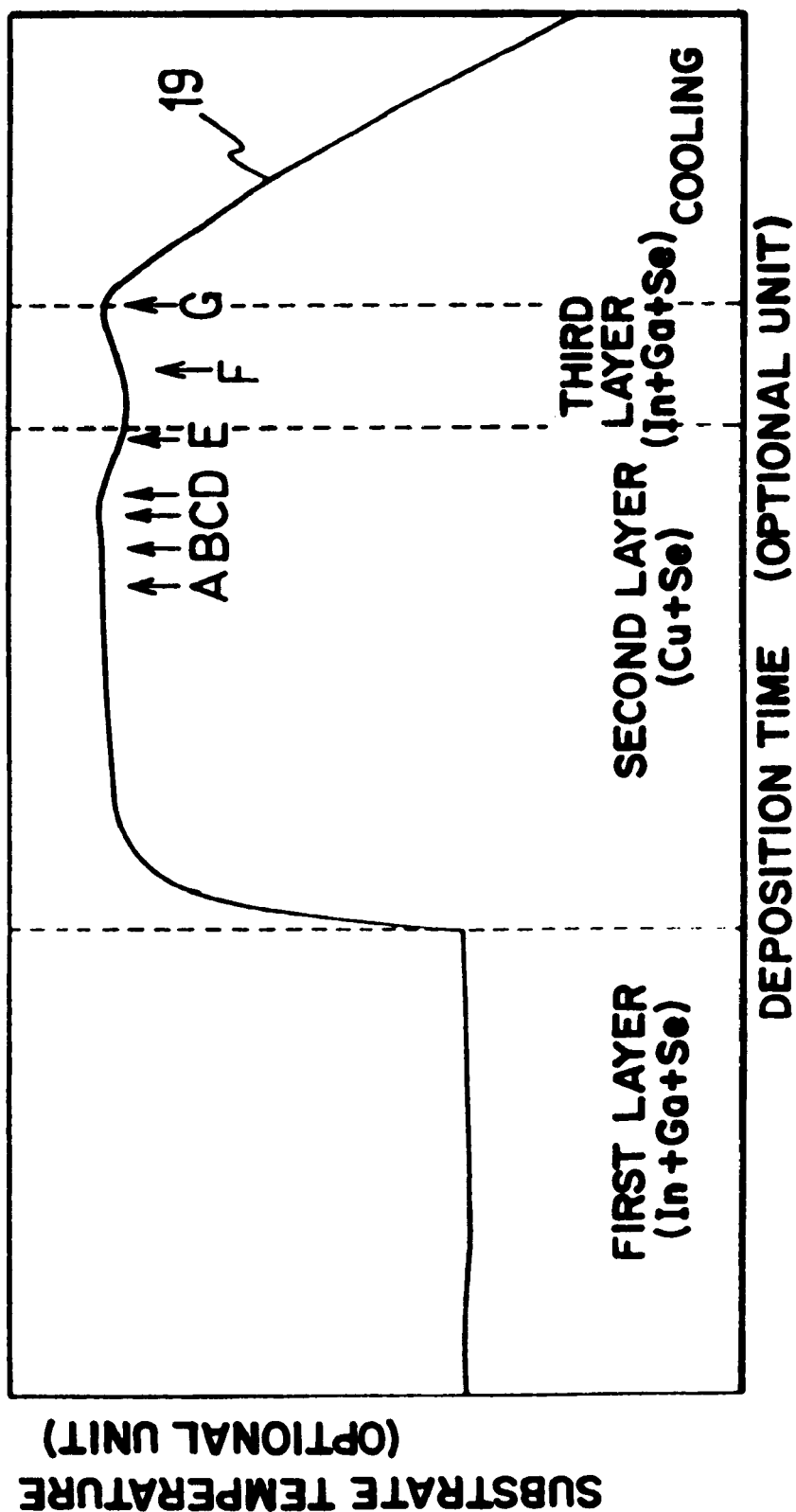
FIG. 2 is a graph showing the change of the substrate temperature when the chalcopyrite semiconductor thin films are formed with using the apparatus of FIG. 1.

FIG. 2 shows the change of the substrate temperature when the Cu(In, Ga)Se$_2$ thin film was formed. The solid line 19 shows the change of the substrate temperature in the process of forming film. The each composition of Cu(In, Ga)Se$_2$ thin films at point A–G on the solid line 19 is shown in the table 1.

TABLE 1

Composition ratio based on energy dispersion-type X-ray measurement.

| Sample | Cu | In | Ga | Se | Cu/(In + Ga) |
|---|---|---|---|---|---|
| Point A | 22.2 | 19.6 | 7.1 | 51.1 | 0.83 |
| Point B | 23.4 | 19.2 | 7.0 | 50.4 | 0.89 |
| Point C | 24.7 | 18.7 | 6.4 | 50.2 | 0.98 |
| Point D | 26.3 | 18.1 | 6.2 | 49.4 | 1.08 |
| Point E | 33.2 | 15.5 | 5.2 | 46.1 | 1.60 |
| Point F | 27.1 | 17.8 | 6.1 | 49.0 | 1.13 |
| Point G | 23.2 | 19.2 | 7.2 | 50.4 | 0.88 |

Table 1 says that in the FIG. 2, points A and B were (In, Ga)-rich composition, point C was the stoichiometric composition, and points D and E were Cu-rich composition. In other words, the composition was recognized as changing from (In, Ga)-rich composition to Cu-rich composition when the substrate temperature 19 started to drop. In addition, when In, Ga, and Se were evaporated after the films had a Cu-rich composition, the change of the substrate temperature was read by the computer 14. If the flux of evaporation was automatically changed to In, Ga, and Se by the use of the shutter 15 installed on the K-cell at Point E when a certain temperature of the substrate dropped as compared with the saturation point shown by Point C, the substrate temperature rose. Thus the composition of Point G showing saturation property turned out to be a preferable composition for solar cells.

As explained above, the manufacturing apparatus comprising the monitoring method made it possible to precisely control the composition essential to the Cu(In, Ga)Se$_2$ thin film solar cell with good reproducibility.

EXAMPLE 2

Figure 3:
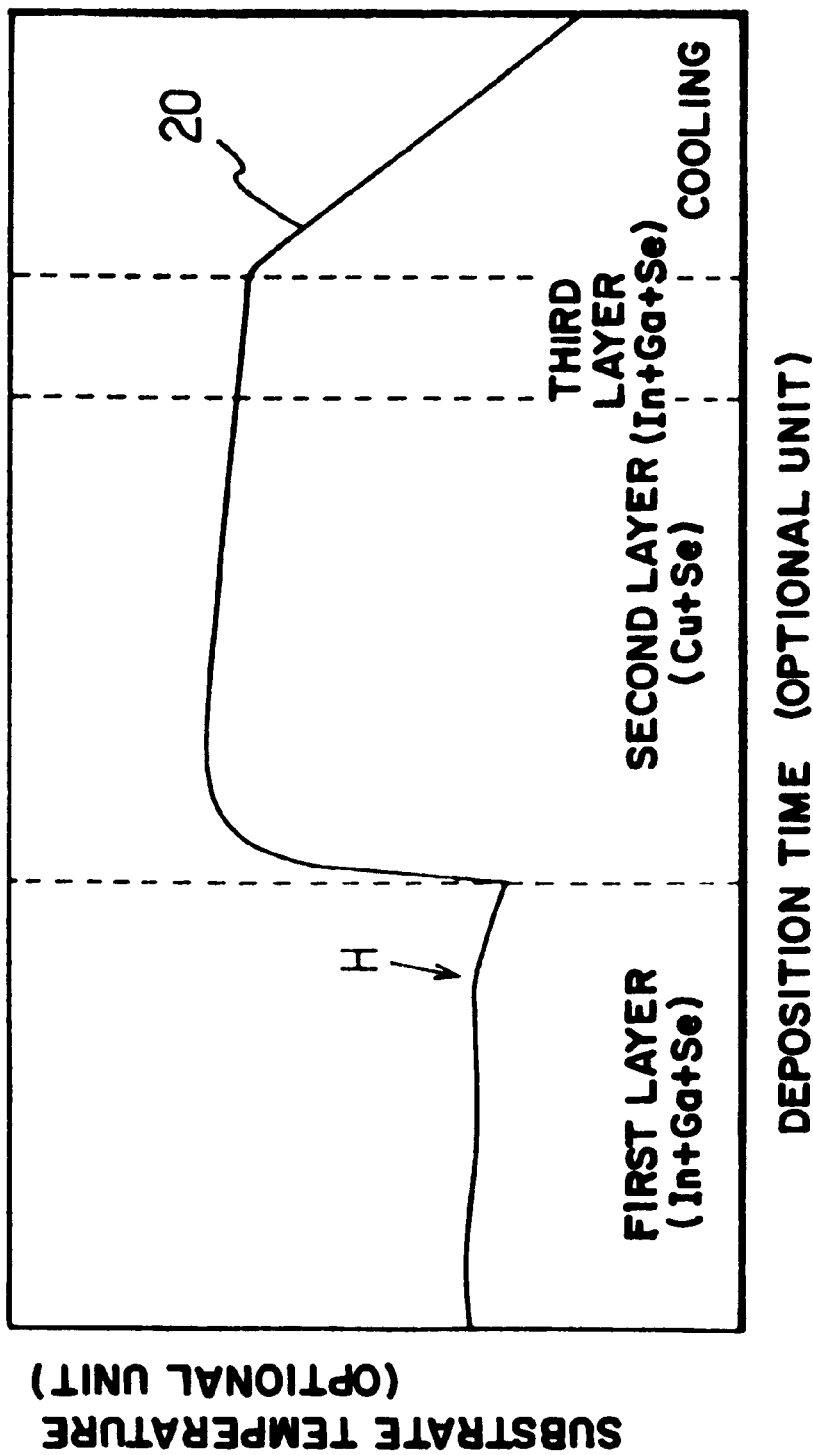
FIG. 3 is a graph showing the change of the substrate temperature when the chalcopyrite semiconductor thin films are formed in the second embodiment of the invention.

This embodiment of the method of manufacturing the chalcopyrite semiconductor thin films of the present invention will be explained as follows. According to the embodiment, Cu(In, Ga)Se$_2$ thin film was formed by the same method and apparatus as in Example 1. FIG. 3 shows the change of the substrate temperature during the formation of the Cu(In, Ga)Se$_2$ thin film. The solid line 20 shows the change of the substrate temperature in the process of forming film. The FIG. 2 shows that the substrate temperature dropped when the composition of films changed from a In-rich composition to a Cu-rich composition in the process of forming the second layer. However, as FIG. 3 shows, the substrate temperature dropped at Point H of the first layer regardless of the change of composition of films. Table 2 shows composition of Cu(In, Ga)Se$_2$ thin films.

TABLE 2

Composition ratio based on energy dispersion-type X-ray measurement.

| Sample | Cu | In | Ga | Se | Se/(Cu + In + Ga) |
|---|---|---|---|---|---|
|  | 24.8 | 19.6 | 8.4 | 47.2 | 0.89 |

The Table 2 says that composition of films given here was Se-deficient. In other words, the substrate temperature dropped because of the deficiency of Se. Se-deficient Cu(In, Ga)Se$_2$ film have a conductive property like metal. Such films can not function as an absorption layer of a solar cell.

As explained above, using the apparatus of the present invention comprising the above mentioned monitoring method, the deficiency of Se could be sensed as soon as possible. As a result, the percent of defective films could be reduced and a yield could be improved.

EXAMPLE 3

Figure 4:
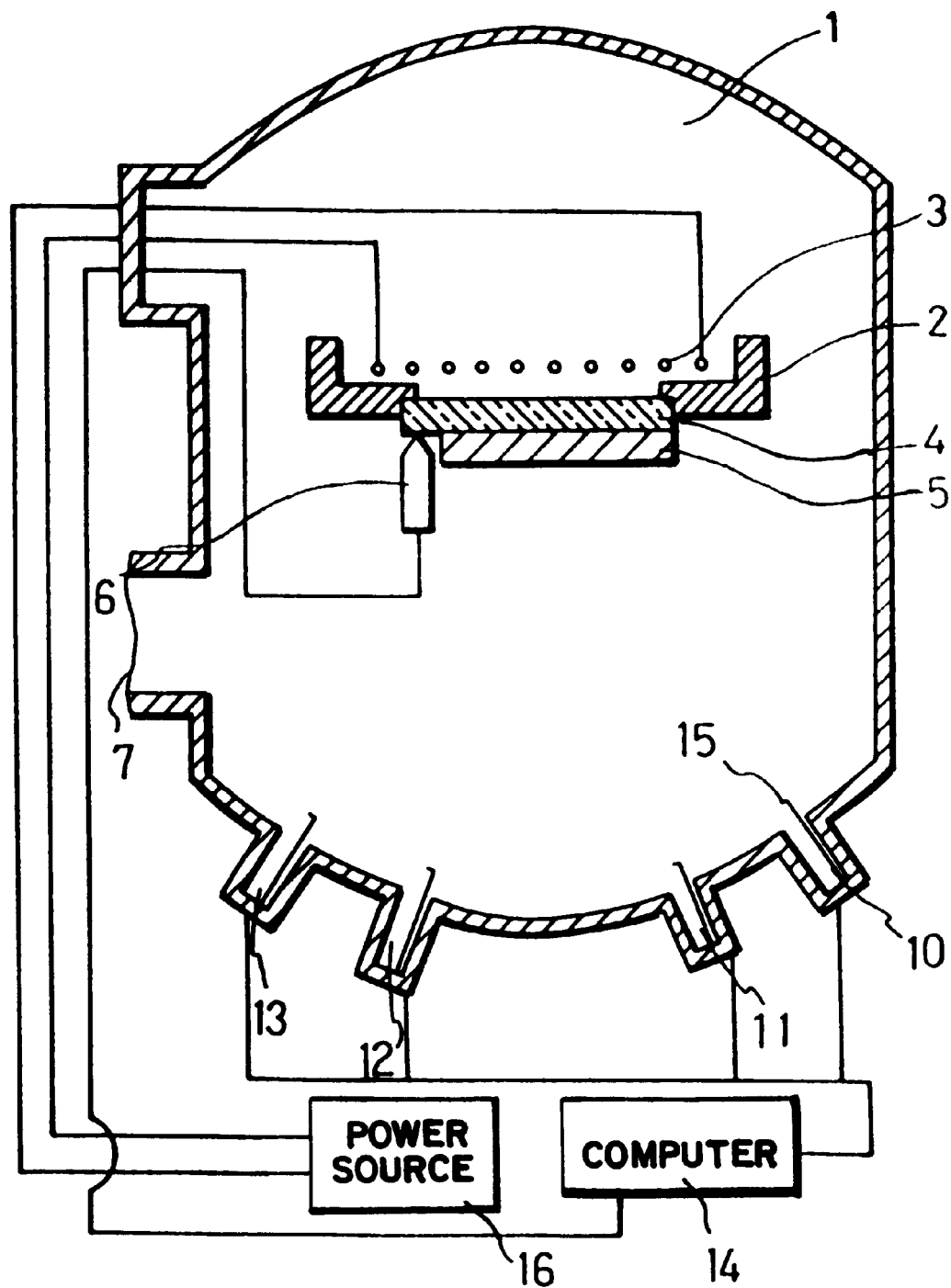
FIG. 4 is a cross sectional view of the apparatus of manufacturing the chalcopyrite semiconductor thin films of the third embodiment of the invention.

FIG. 4 shows the diagram of the apparatus for manufacturing the chalcopyrite semiconductor thin films. In the embodiment of the invention, the thermo-couple 6 for measuring the substrate temperature was installed at the front side of the substrate. The thermo-couple 6 was installed to face a small part of the substrate so as not to cover the entire substrate. Cu(In, Ga)Se$_2$ films were formed by the same method as Example 1, and the same result as in Example 1 was obtained. Consequently, measuring the substrate temperature is not limited to the back side of the substrate.

As explained above, the manufacturing apparatus comprising the above mentioned monitoring method made it possible to precisely control the composition essential to the Cu(In, Ga)Se$_2$ thin film solar cell with good reproducibility.

EXAMPLE 4

Figure 5:
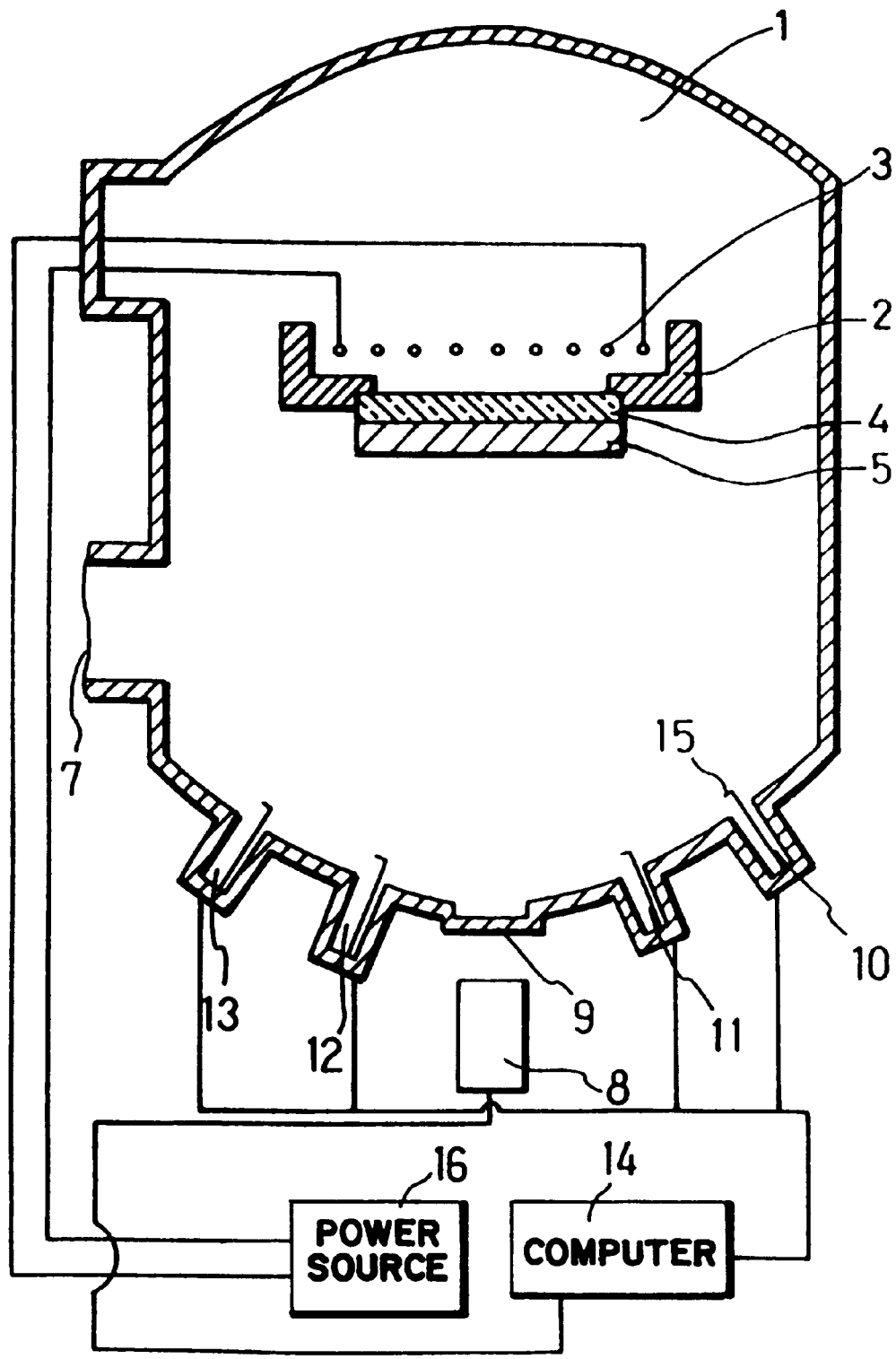
FIG. 5 is a cross sectional view of the apparatus of manufacturing the chalcopyrite semiconductor thin films of the fourth embodiment of the invention.

FIG. 5 shows a diagram of the apparatus for manufacturing the chalcopyrite semiconductor thin films. In this embodiment of the invention, thermometer 8 for measuring intensity of infrared radiation from the surface of the substrate was used to measure the substrate temperature. The transmission window 9 through an infrared spectrum was installed on the vacuum chamber 1 so that the substrate temperature could be measured from the outside of the chamber. When Cu(In, Ga)Se$_2$ films were formed by the same method as Example 1, the same result as in Example 1 was obtained. Consequently, a means of measuring a substrate temperature could be installed outside of the vacuum chamber.

As explained above, the manufacturing apparatus comprising the above mentioned monitoring method made it possible to precisely control the composition with good reproducibility.

EXAMPLE 5

Figure 6:
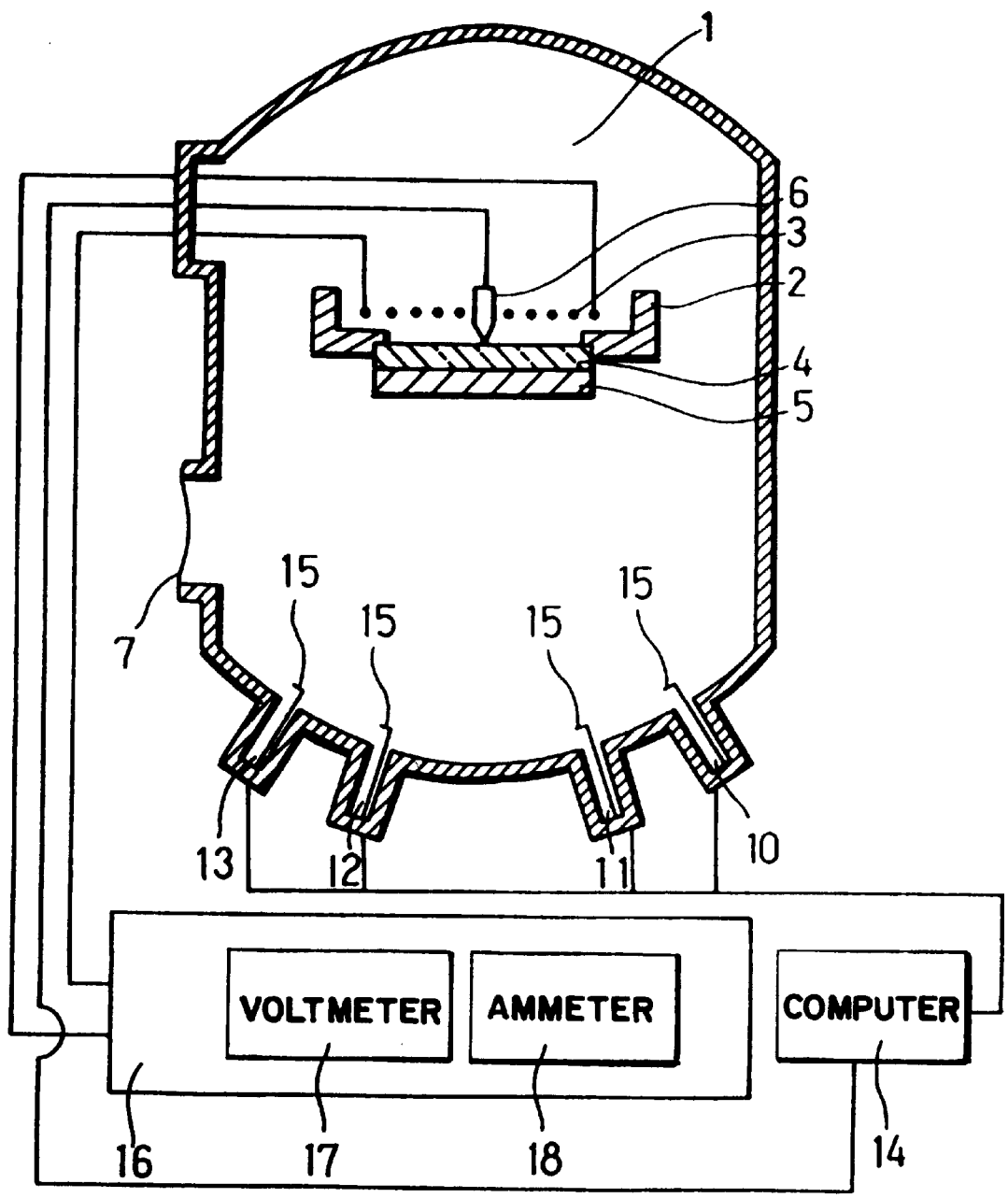
FIG. 6 is a cross sectional view of the apparatus of the fifth embodiment of the invention.

FIG. 6 shows a diagram of the apparatus for manufacturing the chalcopyrite semiconductor thin films. In the embodiment of the mechanism of the present invention, when the substrate was heated, power was supplied to the tantalum heater 3 from the power source 16. In order to obtain the target temperature, a feedback system was installed, whereby the power supplied to the heater could be changed and the substrate temperature could be controlled when a gap between the target temperature and the measured temperature was generated. At this time, in order to keep the substrate at a constant temperature, the change of power supplied to the heater was monitored by a voltmeter 17 or an ammeter 18. The computer 14 was installed so that the flux from the evaporation source could be automatically controlled according to the change of power supplied by opening and closing of the shutter 15 which was installed on the K-cell comprising each evaporation source. The substrate temperature was measured from the back side of the substrate by the thermo-couple 6 installed in the substrate holder. In the vacuum chamber, the main components of Cu(In, Ga)Se$_2$, i.e. evaporation source of Cu, 10; evaporation source of In, 11; evaporation source of Ga, 12; and evaporation source of Se, 13, were provided. In the vacuum of $10^{-7}$ Torr, the temperatures of the evaporation crucible of Cu, In, Ga, and Se were heated respectively to 1220° C., 850° C., 900° C., and 180° C. Cu(In, Ga)Se$_2$ thin films were formed; by evaporating In, Ga, and Se on the first and third layers; and by evaporating Cu and Se on the second layer. At this time, the substrate temperature for the first layer was constant at 300° C.; the substrate temperature for the second and third layers was constant at 550° C. Cu and Se of the second layer were evaporated until the layer had a Cu-rich composition. Moreover, In, Ga, and Se were evaporated again so as to make the final composition ratio (atomic ratio) Cu/(In, Ga)=about 0.8–1.0.

Figure 7:
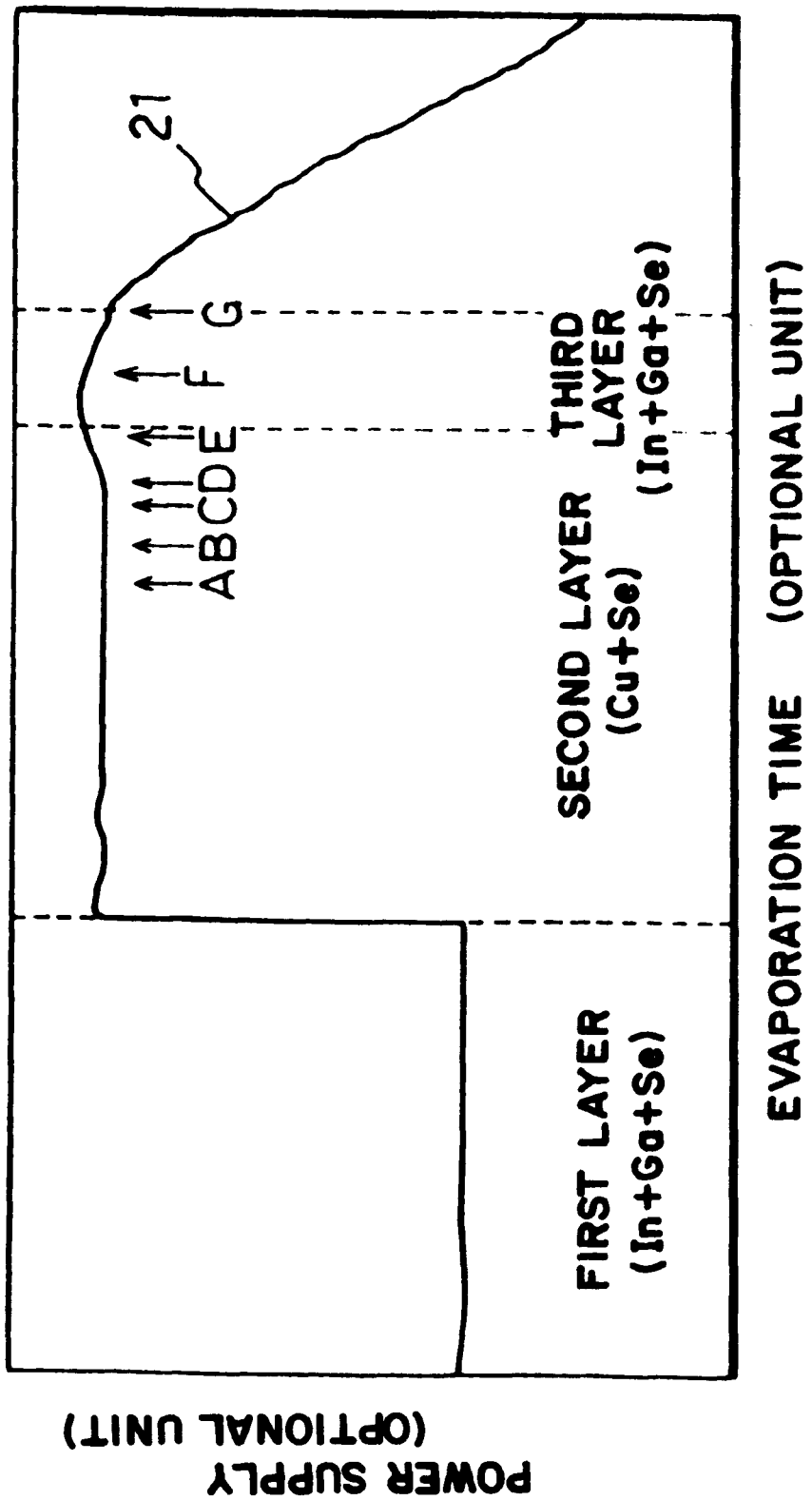
FIG. 7 is a graph showing the change of the power supplied to the mechanism for heating the substrate when the chalcopyrite semiconductor thin films are formed with using the apparatus of FIG. 6.

FIG. 7 shows the change of power supplied to the heater for heating the substrate when Cu(In, Ga)Se$_2$ thin films were formed. The solid line 21 shows the change of the power supplied to the heater in the process of forming films. The each composition of Cu(In, Ga)Se$_2$ thin films at point A–G on the solid line 21 is shown in Table 3.

TABLE 3

Composition ratio based on energy dispersion-type X-ray measurement.

| Sample | Cu | In | Ga | Se | Cu/(In + Ga) |
|---|---|---|---|---|---|
| Point A | 22.2 | 19.6 | 7.1 | 51.1 | 0.83 |
| Point B | 23.4 | 19.2 | 7.0 | 50.4 | 0.89 |
| Point C | 24.7 | 18.7 | 6.4 | 50.2 | 0.98 |
| Point D | 26.3 | 18.1 | 6.2 | 49.4 | 1.08 |
| Point E | 33.2 | 15.5 | 5.2 | 46.1 | 1.60 |
| Point F | 27.1 | 17.8 | 6.1 | 49.0 | 1.13 |
| Point G | 23.2 | 19.2 | 7.2 | 50.4 | 0.88 |

Table 3 says that in the FIG. 7, points A and B were (In,Ga)rich composition; point C was a stoichiometric composition; and points D and E were compositions containing Cu-rich composition. In other words, the composition was recognized changing from (In, Ga)rich composition to Cu-rich composition Cu when the power supplied started to increase in order to heat the substrate temperature which dropped from the point C of the solid line 21 and in order to keep the substrate at a constant temperature. Moreover, after the films had a Cu-rich composition, the change of power supplied was read by the computer 14. If the flux of evaporation was automatically changed to In, Ga, and Se at the shutter 15 installed on the K-cell at Point E when a certain value of the power supplied increased as compared with the saturation point shown by Point C, the power supplied decreased with rising of the substrate temperature. The evaporation of In, Ga, and Se stopped at the Point G showing saturation property. Thus the composition of Point G showing saturation property turned out to be a preferable composition for solar cells.

EXAMPLE 6

Figure 8:
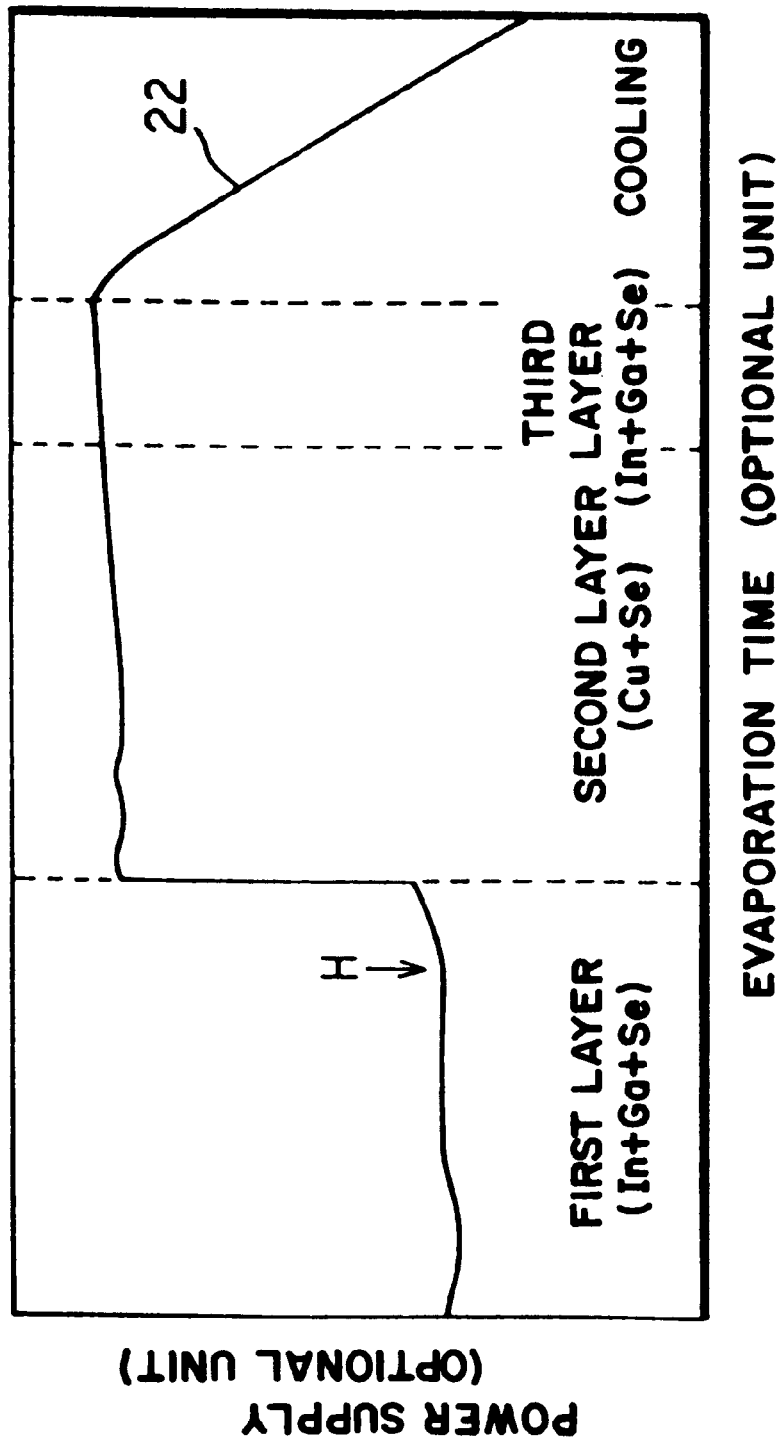
FIG. 8 is a graph showing the change of the power supplied to the mechanism for heating the substrate when the chalcopyrite semiconductor thin films are formed with using the apparatus of FIG. 7 of the sixth embodiment of the invention. .

The embodiment of the method of manufacturing the chalcopyrite semiconductor thin films of the present invention will be explained as follows. According to the embodiment, Cu(In, Ga)Se$_2$ thin film was formed by the same method and apparatus as in Example 1. FIG. 8 shows the change of the power supplied during forming Cu(In, Ga)Se$_2$ film. The solid line 22 shows the change of the power supplied in the process of forming film. The FIG. 7 shows that the power supplied increased when the composition of film changed from In-rich composition to Cu-rich composition in the process of forming the second layer. However, as FIG. 8 shows, the power supplied increased at Point H of the first layer regardless of the change of the composition of films. Table 4 shows the composition of Cu(In, Ga)Se$_2$ thin films.

TABLE 4

Composition ratio based on energy dispersion-type X-ray measurement.

| Sample | Cu | In | Ga | Se | Se/(Cu + In + Ga) |
|---|---|---|---|---|---|
| | 24.8 | 19.6 | 8.4 | 47.2 | 0.89 |

Table 2 says that the composition of films given here was Se-deficient. In other words, the power supplied increased because of a deficiency of Se. Se-deficient Cu(In, Ga)Se$_2$ films have a conductive property like metal. Such films can not function as an absorption layer of solar cell.

As explained above, the apparatus of the present invention comprising the above mentioned monitoring method, the deficiency of Se could be sensed as soon as possible. As a result, the percent of defective films could be reduced and yield could be improved.

EXAMPLE 7

Figure 9:
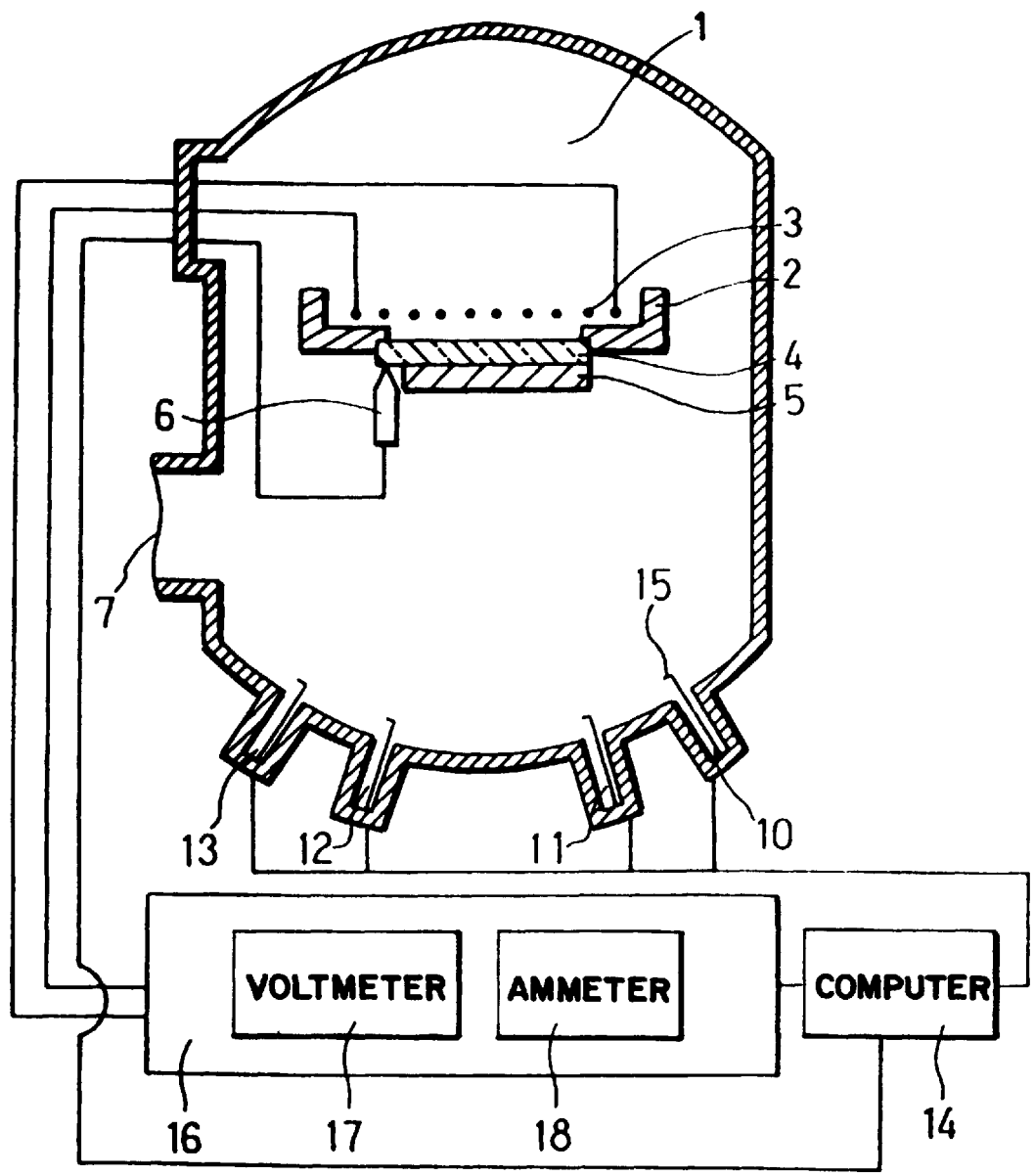
FIG. 9 is a cross sectional view of the apparatus of manufacturing the chalcopyrite semiconductor thin films of the seventh embodiment of the invention.

FIG. 9 shows the diagram of the apparatus of manufacturing the chalcopyrite semiconductor thin films. In the embodiment of the invention, the thermo-couple 6 of measuring the substrate temperature was installed at the-front side of the substrate. The thermo-couple 6 was installed to face a small part of the substrate so as not to cover the entire substrate. Cu(In, Ga)Se$_2$ films were formed by the same method as in Example 5, and the same result as in Example 5 was obtained. Consequently, measuring the substrate temperature is not limited to the back side of the substrate.

As explained above, the manufacturing apparatus comprising the monitoring method shown in the embodiment made it possible to precisely control the composition essential to the Cu(In, Ga)Se$_2$ thin film solar cell with good reproducibility

EXAMPLE 8

Figure 10:
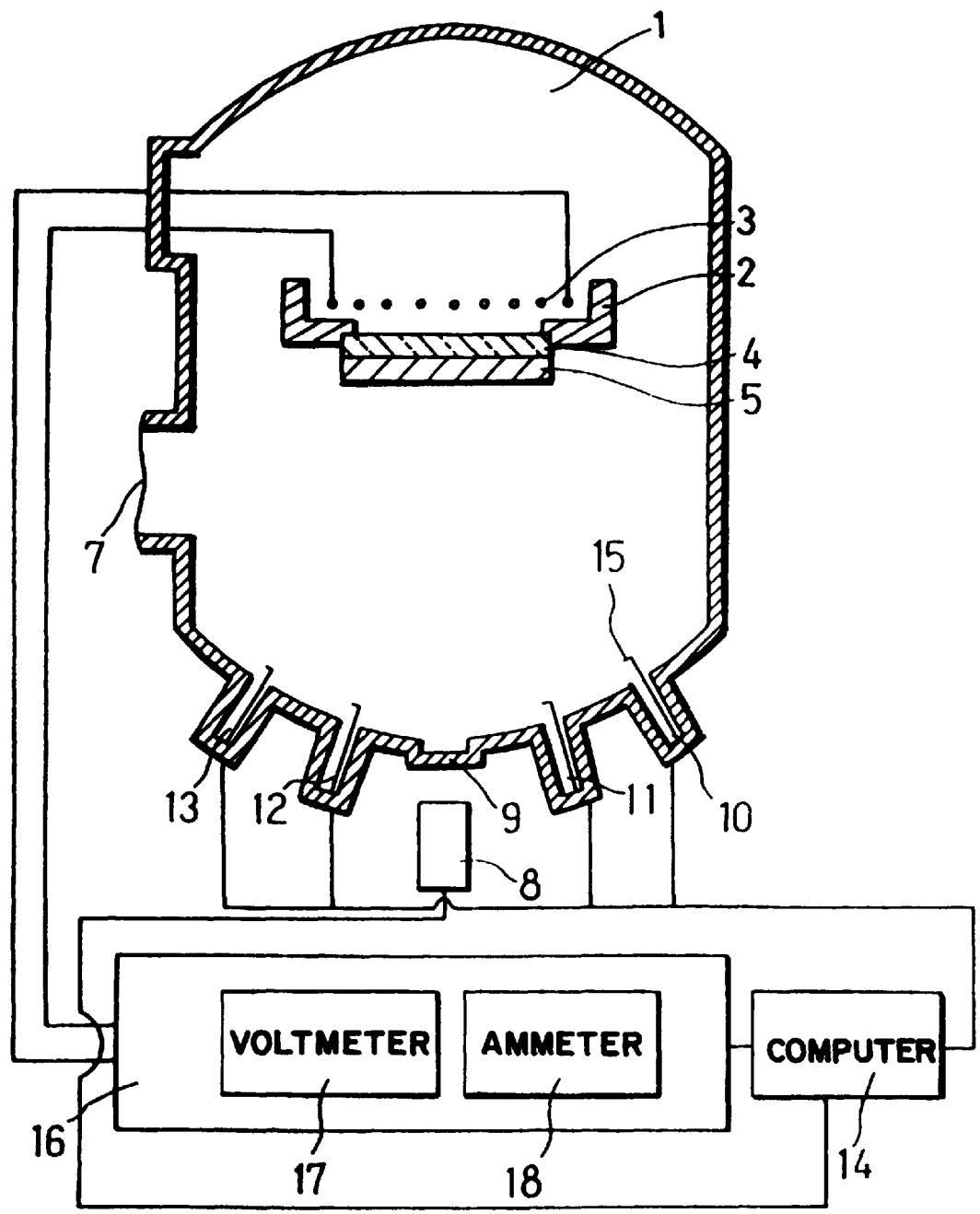
FIG. 10 is a cross sectional view of the apparatus of manufacturing the chalcopyrite semiconductor thin films in the eighth embodiment of the invention.

FIG. 10 shows a diagram of the apparatus of manufacturing the chalcopyrite semiconductor thin films. In this embodiment of the invention, thermometer 8 for measuring intensity of infrared radiation from the surface of the substrate was used to measure the substrate temperature. The transmission window 9 through an infrared spectrum was installed on the vacuum chamber 1 so that the substrate temperature could be measured from the outside of the vessel. When Cu(In, Ga)Se$_2$ films were formed by the same method as in Example 5, and the same result as in Example 5 was obtained. Consequently a means for measuring the substrate temperature is not necessarily installed inside the vacuum chamber.

As explained stated above, the manufacturing apparatus comprising the above mentioned monitoring method made it possible to precisely control the composition with good reproducibility.

As described above, according to the method of manufacturing the chalcopyrite semiconductor thin films of the present invention, by the use of an apparatus comprising a heating element to heat the substrate by releasing a certain quantity of heat and a mechanism of measuring the substrate temperature, the chalcopyrite can be formed as follows: depositing thin films of the first layer comprising at least one compound selected from the group consisting of the above mentioned (A)–(F) on the heated substrate; depositing thin films of the second layer comprising of at least one compound selected from the group consisting of above mentioned (a)–(f) on the first layer in order to form the chalcopyrite semiconductor thin films with a composition containing excessive Group I elements; and depositing thin films of the third layer comprising at least one compound selected from the group consisting of the (A)–(F) again in order to form the chalcopyrite semiconductor thin films with the stoichiometric composition or a composition containing excessive Group III elements. The method and apparatus of the present invention permit control of the composition easily and manufacture of the chalcopyrite semiconductor thin films with good reprudusibility.

Since the apparatus of the present invention is provided with a heating element to heat the substrate by releasing a certain quantity of heat, a mechanism of measuring the heated substrate, and a mechanism of controlling the flux from each evaporation source with the change of the substrate temperature, it permits control of the composition while forming the films. Also, since the apparatus of the present invention is provided with a heating element to heat the substrate, a mechanism for measuring the heated substrate, a power source for the heating element to keep the substrate at a constant temperature, and a mechanism for controlling the flux from each source evaporation source with the change of the power supplied, it permits control of the composition while formation of the films. The apparatus consequently permits formation of the chalcopyrite semiconductor thin films efficiently.

Therefore, according to the method and apparatus of the present invention, high-quality chalcopyrite semiconductor thin films having a controlled composition and applying for the photovoltaic apparatus of thin film solar cells can be formed efficiently with good reproducibility.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, and all changes which come within the meaning and range of equivalency of the claims are intended to be embraced therein.

We claim:

1. A method of manufacturing I-III-VI$_2$ type chalcopyrite semiconductor thin films using an apparatus comprising a heating element to heat a substrate by releasing a certain quantity of heat and an apparatus for measuring the temperature of the heated substrate, which comprises the forming steps of:

depositing a thin film of a first layer comprising at least one member selected from the group consisting of (A)–(F) on the heated substrate:
  (A) Group III elements and Group VIE elements,
  (B) Group III-VI elements compound,
  (C) Group I, III and VI elements in stoichiometric amounts,
  (D) Group I-III-VI$_2$ elements compound with a stoichiometric composition,
  (E) Group I, III, and VI elements in amounts containing excessive Group III elements, and
  (F) Group I-III-VI$_2$ element compound with a composition containing excessive Group III elements;

depositing a thin film in a second layer comprising at least one compound selected from the group consisting of (a)–(f) on the first layer in order to form a chalcopyrite semiconductor thin film with a composition containing excessive Group I elements:

(a) Group I elements and Group VI elements,
(b) Group I-VI elements compound,
(c) Group I, III, and VI elements in stoichiometric amounts,
(d) Group I-III-VI$_2$ elements compound with a stoichiometric composition,
(e) Group I, III and VI elements in amounts containing excessive Group I elements, and
(f) Group I-III-VI$_2$ elements compound with a composition containing excessive Group I element;

wherein the deposition of the second layer stops when the substrate temperature drops after saturation during the deposition of the second layer; and depositing a thin film in a third layer comprising at least one compound selected from the group consisting of said (A)–(F) again in order to form the chalcopyrite semiconductor thin film whose entire composition is stoichiometric or has excessive Group III elements;

wherein the deposition of the third layer stops when the dropped temperature of the substrate increases and shows saturation again during the deposition of the third layer.

2. The method of manufacturing the chalcopyrite semiconductor thin films of claim 1, wherein the substrate temperature is kept at a higher temperature than the dissolving temperature of Group I-VI elements compound in the process of the deposition of the second layer.

3. The method of manufacturing the chalcopyrite semiconductor thin films of claim 1, wherein the forming process stops when a drop of the substrate temperature is observed at a different point than that when the substrate temperature drops at the saturation point during deposition of the second layer in the process of the deposition of the said first, second, and third layers.

4. The method of manufacturing the chalcopyrite semiconductor thin films of claim 2, wherein evaporation of Group VI elements compound is supplemented after the formation of films stops.

5. The method of manufacturing the chalcopyrite semiconductor thin films of claim 1, wherein at least one element selected from the group consisting of Cu and Ag is used as Group I elements.

6. The method of manufacturing the chalcopyrite semiconductor thin films of claim 1, wherein at least one element selected from the group consisting of In, Ga, and Al is used as Group III elements.

7. The method of manufacturing the chalcopyrite semiconductor thin films of claim 1, wherein at least one element selected from the group consisting of S, Se and Te is used as Group VI elements.

8. The method of manufacturing the chalcopyrite semiconductor thin films of claim 1, wherein the apparatus comprises a power source for the heating element to keep the substrate at a certain temperature and a mechanism for monitoring the change of the power supplied to the heating element as a substitute for the heating element to heat the substrate by releasing a certain quantity of heat.

9. The method of manufacturing the chalcopyrite semiconductor thin films of claim 8, wherein the substrate temperature is kept at a higher temperature than the dissolving temperature of Group I-VI elements compound in the process of the deposition of the second layer.

10. The method of manufacturing the chalcopyrite semiconductor thin films of claim 8, wherein the forming process stops when an increase of the power supplied to the heating element is observed at the different point than that when the power supplied to the heating element increases at the saturation point during deposition of the second layer in the process of the deposition of the said first, second, and third layers.

11. The method of manufacturing the chalcopyrite semiconductor thin films of claim 10, wherein evaporation of Group VI elements is supplemented after the formation of films stops.

12. The method of manufacturing the chalcopyrite semiconductor thin films of claim 8, wherein at least one element selected from the group consisting of Cu and Ag is used as Group I elements.

13. The method of manufacturing the chalcopyrite semiconductor thin films of claim 8, wherein at least one element selected from the group consisting of In, Ga, and Al is used as III group elements.

14. The method of manufacturing the chalcopyrite semiconductor thin films of claim 8, wherein at least one element selected from consisting of S, Se and Te is used as Group VI elements.

15. The method of manufacturing the chalcopyrite semiconductor thin films of claim 1, wherein the thickness of the first layer is 0.1–2.5 $\mu$m, that of the second layer is 0.1–1.5 $\mu$m, that of the third layer is 0.1–2.0 $\mu$m, and the total thickness of the thin films is 0.3–6.0 $\mu$m.

* * * * *